United States Patent
Kroeckel et al.

(10) Patent No.: US 6,433,546 B1
(45) Date of Patent: Aug. 13, 2002

(54) MAGNETIC RESONANCE TRANSMISSION METHOD SUPPLYING FRACTION OF OUTPUT SIGNAL TO RECEIVER AND USING INTERMEDIATE SIGNAL AS SCANNING SIGNAL

(75) Inventors: Horst Kroeckel, Bamberg; Werner Lindstedt, Kalchreuth; Georg Pirkl, Dormitz, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/526,410

(22) Filed: Mar. 16, 2000

(30) Foreign Application Priority Data

Mar. 17, 1999 (DE) .......................... 199 11 975

(51) Int. Cl.$^7$ .............................................. G01V 3/00
(52) U.S. Cl. ........................................ 324/314; 324/309
(58) Field of Search ............................ 324/312, 309, 324/313, 314, 322, 318, 319, 320, 321, 300, 306, 307

(56) References Cited

U.S. PATENT DOCUMENTS

| | | | |
|---|---|---|---|
| 3,824,451 A | 7/1974 | Freeman et al. ............ 324/312 |
| 4,034,191 A | 7/1977 | Tomlinson et al. ......... 324/312 |
| 4,689,563 A | * 8/1987 | Bottomley et al. ......... 324/309 |
| 4,694,254 A | 9/1987 | Vatis et al. ................. 324/309 |

FOREIGN PATENT DOCUMENTS

| DE | 19911975 A1 | * 9/2000 |
|---|---|---|
| DE | 19911975 C2 | * 3/2001 |

* cited by examiner

*Primary Examiner*—Edward Lefkowitz
*Assistant Examiner*—Tiffany A. Fetzner
(74) *Attorney, Agent, or Firm*—Schiff Hardin & Waite

(57) ABSTRACT

In a magnetic resonance transmission method and magnetic resonance transmission operating therewith a high-frequency power amplifier emits an output signal with an actual amplitude and an actual phase to a magnetic resonance transmission antenna. A fraction of the signal is digitilized in a magnetic resonance receiver and is supplied to a pulse controller that is realized in software. An analog magnetic resonance reception signal of an object can be supplied to the magnetic resonance receiver during the pulses. The pulse controller determines correction values for a generator amplitude and a generator phase with which a pulse generator is driven, the pulse generator being connected upstream relative to the high-frequency amplifier.

9 Claims, 1 Drawing Sheet

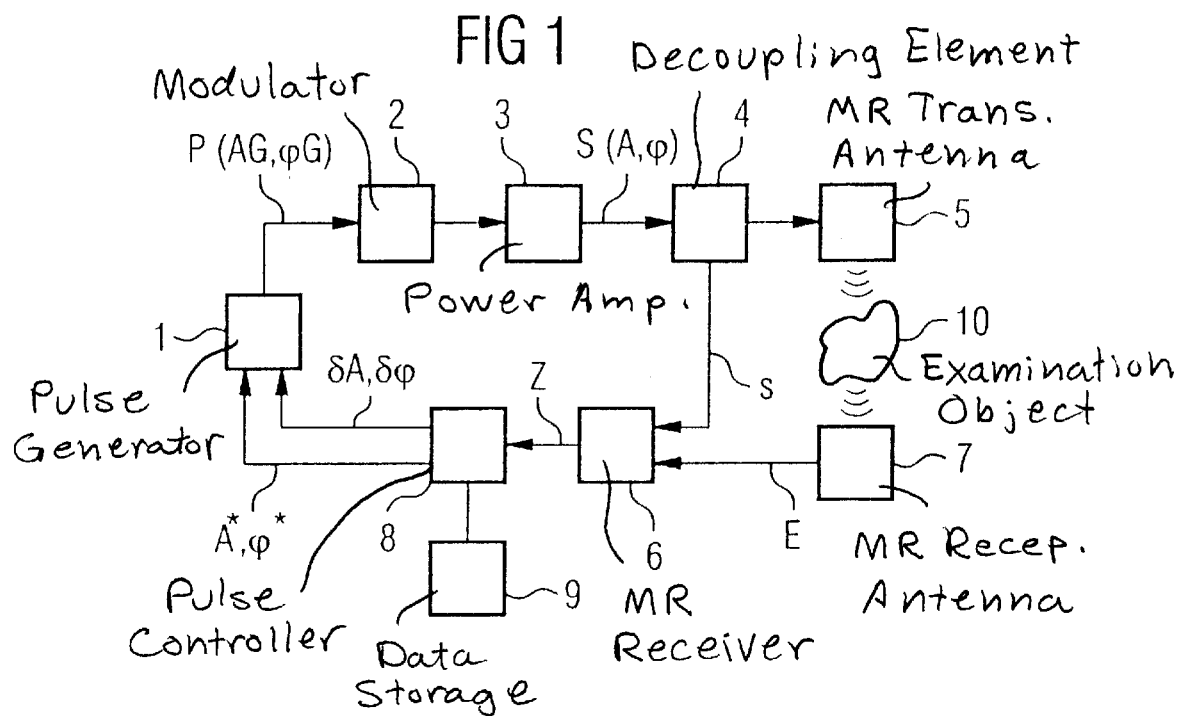
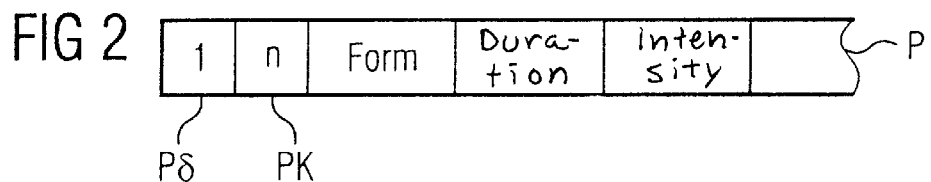
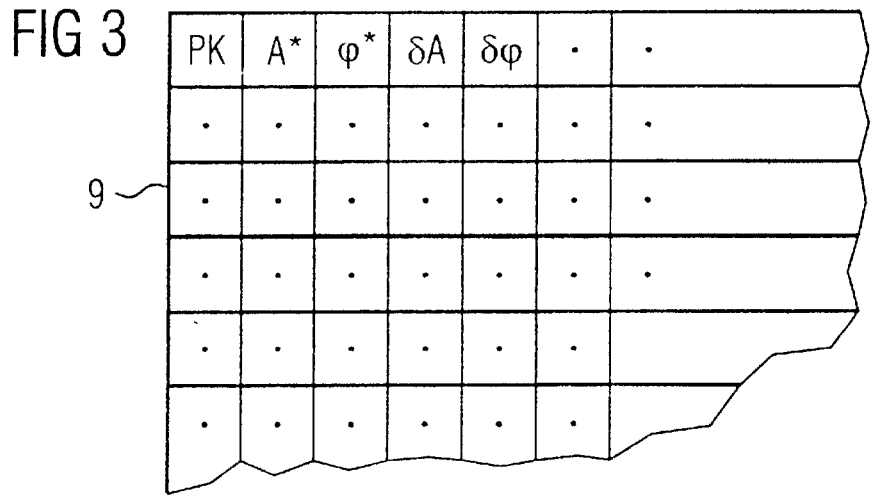

MAGNETIC RESONANCE TRANSMISSION METHOD SUPPLYING FRACTION OF OUTPUT SIGNAL TO RECEIVER AND USING INTERMEDIATE SIGNAL AS SCANNING SIGNAL

BACKGROUND OF THE INVENTION

1. Field of the Invention

The present invention is directed to a magnetic resonance tomography apparatus and magnetic resonance method for operating the device.

2. Description of the Prior Art

Magnetic resonance transmission methods and tomography apparatuses are known wherein a pulse generator drives a high-frequency modulator with a pulse with a generator amplitude and a generator phase, the high-frequency modulator actuates a high-frequency power amplifier, the high-frequency power amplifier emits an analog output signal with an actual amplitude and an actual phase to a magnetic resonance transmission antenna, a scanning signal that corresponds to the output signal is supplied to a pulse controller, which compares the actual amplitude with a set amplitude and the actual phase with a set phase and which determines correction values for the generator amplitude and the generator phase and supplies these to the pulse generator for emitting a further pulse, and wherein, between pulses, a magnetic resonance reception antenna supplies an analog magnetic resonance reception signal of an object to a magnetic resonance reception receiver, which emits a digital intermediate signal as an output.

Such known magnetic resonance transmission methods and magnetic resonance transmission arrangements that correspond therewith are used to generate exactly reproducible output signals for a longer period of time.

In the known methods and apparatuses, the output signal is acquired and is supplied to an analog regulator circuit. The regulator circuit has to be designed with high precision, temperature-stable and therefore expensive components.

SUMMARY OF THE INVENTION

An object of the present invention is to provide a magnetic resonance transmission method and a magnetic resonance transmission arrangement which are operable without high precision components.

This object is achieved in a magnetic resonance transmission method in An accordance with the invention wherein a fraction of the output signal is supplied to the aforementioned magnetic resonance receiver during the pulses and the thus-obtained intermediate signal which is emitted is supplied to the pulse controller as a scanning signal, and wherein the pulse controller digitally processes the intermediate signal.

This object is achieved in a magnetic resonance transmission arrangement in accordance with the invention wherein the decoupling element is also connected to the magnetic resonance receiver, and the magnetic resonance receiver is connected to the pulse controller, and the pulse controller is fashioned as a software controller.

Due to the usage of the magnetic resonance receiver that is present anyway, a dedicated component is not required for the processing or preparation of the fraction of the output signal. Moreover, a regulator that does not require high precision components and that exhibits a hitherto unachieved flexibility results from the digital regulation, which preferably ensues in a microprocessor.

For example, the pulse can be one of a number of pulse types, with a type-specific set amplitude, a type-specific set phase and type-specific correction values being stored for each pulse type. The type-specific set amplitude and the type-specific set phase and, if necessary the type-specific correction values as well, are consulted for determining the correction values.

Corresponding herewith, the magnetic resonance transmission arrangement has a pulse type identifier and a memory for storing and retrieving type-specific set amplitudes, type-specific set phases and type-specific correction values.

It is also possible for the determination of the correction values to ensue only when a correction request is allocated to the pulse.

The set amplitude and the set phase are preferably determined by generating a preset number of pulses, determining the actual amplitude and the actual phase for each of these pulses forming average values before the amplitude regulation and phase regulation are performed.

DESCRIPTION OF THE DRAWINGS

FIG. 1 is a block diagram of a magnetic resonance transmission arrangement constructed and operating in accordance with the invention.

FIG. 2 shows a pulse dataset employed in the inventive method and arrangement.

FIG. 3 illustrates a data storage format employed in the inventive method and arrangement.

DESCRIPTION OF THE PREFERRED EMBODIMENTS

As shown in FIG. 1, a magnetic resonance transmission arrangement has a pulse generator 1 that is connected to a high-frequency modulator 2. The high-frequency modulator 2 is driven with a pulse P having a generator amplitude AG and a generator phase φ G.

The high-frequency modulator 2 is connected to a high-frequency power amplifier 3, so that the high-frequency modulator 2 drives the high-frequency power amplifier 3. A decoupling element 4 is arranged downstream relative to the highfrequency power amplifier 3. A magnetic resonance antenna 5 is arranged downstream relative to the decoupling element 4.

An analog output signal S with an actual amplitude A and an actual phase (p can therefore be emitted as an output to the magnetic resonance antenna 5.

The decoupling element 4 is fashioned as a directional coupler. An (analog) fraction s of the output signal S can be decoupled from the output signal S by the decoupling element 4. The decoupling element 4 is connected to a magnetic resonance receiver 6. Therefore, the fraction s is supplied to the magnetic resonance receiver 6 during the pulses P.

Further, the magnetic resonance receiver 6 is connected to a magnetic resonance reception antenna 7. From this magnetic resonance reception antenna 7, a magnetic resonance reception signal E of an object 10 (the magnetic resonance reception signal E also being analog), is supplied to the magnetic resonance receiver 6 between two pulses P. This is possible, since the magnetic resonance reception antenna 7, for system related reasons, does not receive a utilizable magnetic resonance reception signal E during a pulse P.

The magnetic resonance receiver 6 demodulates the respective signals s and E supplied to it and emits a digital intermediate signal Z. During a pulse P. the intermediate signal Z therefore corresponds to the actual amplitude A and actual phase φ of the output signal S with respect to amplitude and phase. The magnetic resonance receiver 6 is connected to a microprocessor, serving as a pulse controller 8, which has a data storage 9 allocated. During a pulse P, the intermediate signal Z is supplied to the pulse controller 8 as a scanning signal. The pulse controller 8 is designed as a software controller, which digitally processes the intermediate signal Z. The control algorithm can selectively model a P-controller type, a PI-controller type, a PID controller type or another controller type.

The pulse controller 8 compares the actual amplitude A with a set amplitude A* and compares the actual phase φ with a set phase φ*. The pulse controller 8 determines correction values δA, δφ for the generator amplitude AG and the generator phase (pG on the basis of the comparison. The correction values δA, δφ are stored in the data storage 9 and are supplied to the pulse generator 1 given a further pulse P. The pulse controller 8 is connected to said pulse generator 1 for this purpose.

According to FIG. 2, a correction request Pδ can be allocated to the pulse P. The microprocessor serving as the pulse controller 8 checks each pulse P to determine whether a correction request Pδ is allocated to the pulse P. The correction values δA, δφ, which were determined with respect to the previous pulse P, are always supplied to the pulse generator 1. When a correction request Pδ is not allocated to the pulse P, however, the correction values δA, δφ are not determined and updated for this pulse P. Otherwise, the correction values δA, δφ are determined and stored.

Magnetic resonance cycles are normally formed by a number of pulses P, which can be divided into different pulse types. It is therefore possible to allocate a pulse type identification PK to each pulse P to be emitted. For each pulse type, the set amplitude A* and the set phase φ* can be different from the set amplitudes A* and set phases (φ* of other pulse types. The correction values δA, δφ also can differtype-specifically from one another.

Therefore, a type-specific set amplitude A*, a type-specific set phase φ* and type-specific correction values δA, δφ are preferably stored in the data storage 9 for each pulse type, as shown to FIG. 3.

The pulse type is initially determined for determining the correction values 5A, δφ for a pulse P of a pulse type. The type-specific set amplitude A*, the type-specific set phase φ* and the type-specific correction values δA, δφ of this pulse type are subsequently retrieved from the data storage 9 and are consulted for correcting the actuation of the pulse generator 1. Correction values δA, δφ that, if necessary, are newly determined for this pulse type are stored in the data storage 9 again.

Initially, the set amplitude A* and the set phase φ* can be freely selected within specific limits, however, they must be kept constant after initially being set. For example, it is possible to determine the set amplitude A* and the set phase φ* possibly in a type-specific manner by generating a preset number of pulses P, determining the actual amplitude A and actual phase φ of each pulse, and forming average values of the amplitude and phase before the amplitude regulation and phase regulation are performed.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance transmission method comprising the steps of:

emitting an initial pulse with a generator amplitude and a generator phase from a pulse generator to a high-frequency modulator, and subsequently generating a subsequent pulse in said pulse generator for supply to said high-frequency modulator;

driving a high-frequency power amplifier with said high-frequency modulator to cause said high-frequency power amplifier to emit an analog output signal, having an actual amplitude and an actual phase, based on said initial pulse;

driving a magnetic resonance transmission antenna with said analog output signal to excite nuclear spins in an examination object, and receiving an analog magnetic resonance reception signal arising from said nuclear spins with a magnetic resonance reception antenna;

during said initial pulse, supplying a fraction of said analog output signal to a magnetic resonance receiver and, between said initial pulse and said subsequent pulse, supplying said analog magnetic resonance reception signal to said magnetic resonance receiver and, in said magnetic resonance receiver, generating a digital intermediate signal from said fraction of said analog output signal and said analog magnetic reception signal, said intermediate signal being a scanning signal and representing said actual amplitude and said actual phase during said initial pulse;

supplying said intermediate signal to a pulse controller and digitally processing said intermediate signal in said pulse controller to compare said actual amplitude with a set amplitude to obtain an amplitude correction value and to compare said actual phase with a set phase to obtain a phase correction value; and supplying said set amplitude and said amplitude correction value, and said set phase and said phase correction value, to said pulse generator from said pulse controller and, in said pulse generator, using said set amplitude and said amplitude correction value, and said set phase and said phase correction value to generate said subsequent pulse.

2. A method as claimed in claim 1 comprising the additional steps of:

allocating said initial pulse to one of a plurality of pulse types;

storing a typespecific set amplitude and a type-specific set phase and a typespecific amplitude correction value and a type-specific phase correction value for each of said pulse types; and in said pulse controller, generating said amplitude correction value from said type-specific set amplitude and, if necessary, from said type-specific amplitude correction value, and generating said phase correction value from said type-specific set phase and, if necessary, said type-specific phase correction value.

3. A method as claimed in claim 1 comprising the additional steps of:

selectively allocating a correction request to said initial pulse; and in said pulse controller, determining said amplitude correction value and said phase correction value only for a pulse having said correction request allocated thereto.

4. A method as claimed in claim 1 comprising the additional steps of:

before generating said initial pulse, generating a plurality of predecessor pulses each having a predecessor pulse amplitude and predecessor pulse phase;

driving said high-frequency modulator, said power amplifier, said magnetic resonance transmission antenna and said magnetic resonance reception antenna to obtain a plurality of analog magnetic resonance reception signals respectively based on said predecessor pulses; and in said magnetic resonance receiver, determining an amplitude average of said predecessor pulse amplitudes and using said amplitude average as said set amplitude, and determining a phase average of said predecessor pulse phases and using said phase average as said set phase.

5. A magnetic resonance tomography apparatus comprising:

a pulse generator which emits an initial pulse with a generator amplitude and a generator phase, and which subsequently emits a subsequent pulse;

a high-frequency modulator connected to said pulse generator and receiving said initial pulse and said subsequent pulse therefrom;

high-frequency power amplifier connected to and driven by with said high-frequency modulator to emit an analog output signal, having an actual amplitude and an actual phase, based on said initial pulse;

a decoupling unit which forwards said analog output signal and which also forms a fraction of said analog output signal;

a magnetic resonance transmission antenna connected to said decoupling unit and driven with said analog output signal to excite nuclear spins in an examination object;

a magnetic resonance reception antenna which receives an analog magnetic resonance reception signal arising from said nuclear spins;

a magnetic resonance receiver connected to said decoupling unit and to said reception antenna which, during said initial pulses receives said fraction of said analog output signal and which, between said initial pulse and said subsequent pulse, receives said analog magnetic resonance reception signal, said magnetic resonance receiver, generating a digital intermediate signal, as a scanning signal, from said fraction of said analog output signal and said analog magnetic reception signal, said intermediate signal representing said actual amplitude and said actual phase during said pulse;

a pulse controller connected to said magnetic resonance receiver and receiving said intermediate signal therefrom and which digitally processes said intermediate signal by comparing said actual amplitude with a set amplitude to obtain an amplitude correction value and comparing said actual phase with a set phase to obtain a phase correction value, and said pulse generator being connected to said pulse controller and being supplied with said set amplitude and said amplitude correction value, and said set phase and said phase correction value, and said pulse generator using said set amplitude and said amplitude correction value, and said set phase and said phase correction value to generate said subsequent pulse.

6. An apparatus as claimed in claim 5 wherein said pulse generator generates said initial pulse as one of a plurality of pulse types, and said apparatus further comprising a memory for storing a type-specific set amplitude and a typespecific set phase and a type-specific amplitude correction value and a type-specific phase correction value for each of said pulse types, and wherein said pulse controller generates said amplitude correction value from said type-specific set amplitude and, if necessary, from said typespecific amplitude correction value, and generates said phase correction value from said type-specific set phase and, if necessary, said typespecific phase correction value.

7. An apparatus as claimed in claim 5 wherein said pulse generator selectively allocates a correction request to said initial pulse, and wherein said pulse controller determines said amplitude correction value and said phase correction value only for a pulse having said correction request allocated thereto.

8. An apparatus as claimed in claim 5 wherein said pulse generator, before generating said initial pulse, generates a plurality of predecessor pulses each having a predecessor pulse amplitude and predecessor pulse phase, wherein said highfrequency modulator, said power amplifier, said magnetic resonance transmission antenna and said magnetic resonance reception antenna are driven to obtain a plurality of analog magnetic resonance reception signals respectively based on said predecessor pulses, and wherein said magnetic resonance receiver, determines an amplitude average of said predecessor pulse amplitudes and uses said amplitude average as said set amplitude, and determines a phase average of said predecessor pulse phases and uses said phase average as said set phase.

9. An apparatus as claimed in claim 5 wherein said decoupling unit is a bidirectional coupler.

* * * * *